(12) United States Patent
Lai et al.

(10) Patent No.: US 11,439,031 B2
(45) Date of Patent: Sep. 6, 2022

(54) LATCH MECHANISM AND ELECTRONIC DEVICE CASE

(71) Applicant: LUXSHARE PRECISION INDUSTRY CO., LTD., Shenzhen (CN)

(72) Inventors: Zhongyuan Lai, Shenzhen (CN); Liang Yu, Shenzhen (CN)

(73) Assignee: LUXSHARE PRECISION INDUSTRY CO., LTD., Shenzhen (CN)

( * ) Notice: Subject to any disclaimer, the term of this patent is extended or adjusted under 35 U.S.C. 154(b) by 30 days.

(21) Appl. No.: 17/229,110

(22) Filed: Apr. 13, 2021

(65) Prior Publication Data

US 2022/0078932 A1 Mar. 10, 2022

(30) Foreign Application Priority Data

Sep. 10, 2020 (CN) .......................... 202010948607.8

(51) Int. Cl.
*H05K 5/02* (2006.01)
*H05K 5/00* (2006.01)
*E05C 1/10* (2006.01)

(52) U.S. Cl.
CPC ............. *H05K 5/0221* (2013.01); *E05C 1/10* (2013.01); *H05K 5/0004* (2013.01)

(58) Field of Classification Search
CPC ...................................................... H05K 5/00
See application file for complete search history.

(56) References Cited

U.S. PATENT DOCUMENTS 6,115,239 A * 9/2000 Kim ...................... G06F 1/1616
361/740
7,184,262 B2 * 2/2007 Hsu ...................... G06F 1/1679
361/679.55

(Continued)

FOREIGN PATENT DOCUMENTS

CN 202135427 U 2/2012
CN 108022779 A 5/2018

(Continued)

OTHER PUBLICATIONS

Chinese Office Action and Search Report for Chinese Application No. 202010948607.8, dated May 27, 2021, with English translation.

*Primary Examiner* — Jerry Wu
(74) *Attorney, Agent, or Firm* — Birch, Stewart, Kolasch & Birch, LLP

(57) ABSTRACT

Provided are a latch mechanism and an electronic device case. The latch mechanism includes a base assembly, a pressing assembly and a first elastic member. The base assembly has an accommodating cavity, and a wall surface of the base assembly has a first through hole and a second through hole which are respectively communicated with the accommodating cavity. The pressing assembly includes a main body part, a button part and a bolt part, the main body part is disposed in the accommodating cavity, and the button part and the bolt part are respectively disposed on the main body part. The first elastic member is located in the accommodating cavity, one end of the first elastic member abuts against an inner wall of the accommodating cavity and the other end abuts against the main body part.

18 Claims, 12 Drawing Sheets

(56) References Cited

U.S. PATENT DOCUMENTS

2006/0166083 A1    7/2006   Zhang et al.
2010/0001538 A1    1/2010   Kim et al.

FOREIGN PATENT DOCUMENTS

| | | |
|---|---|---|
| CN | 207733100 U | 8/2018 |
| CN | 108811383 A | 11/2018 |
| CN | 209562987 U | 10/2019 |
| CN | 210691220 U | 6/2020 |
| TW | 201818399 A | 5/2018 |

* cited by examiner

LATCH MECHANISM AND ELECTRONIC DEVICE CASE

CROSS-REFERENCE TO RELATED APPLICATION

This application claims priority to Chinese Patent Application No. 202010948607.8 filed Sep. 10, 2020, the disclosure of which is incorporated herein by reference in its entirety.

TECHNICAL FIELD

The present disclosure relates to the technical field of electronic devices and, in particular, to a latch mechanism and an electronic device case.

BACKGROUND

Currently, in order to prevent an electronic product from being collided or entering water, a protective shell is usually installed on the electronic product. When the electronic product need to be used or replaced, the protective shell is lifted, where one end of the protective shell is pivotally connected to the electronic product, and the other end of the protective shell can be locked on the electronic product through a lock catch structure.

In the related art, the lock catch structure includes a knob, a rotary rod, an elliptical turntable, two coupling levers, an inserted rod and a limiting mechanism. When the protective shell is locked on the lock catch structure, the knob is rotated to drive the rotary rod to rotate, the rotary rod drives the elliptical turntable to rotate, the elliptical turntable drives the two coupling levers to move towards each other, and the two coupling levers drive the inserted rod to slide in an inner cavity of a through hole of a clamping cover until the inserted rod is moved out of a clamping groove of the clamping cover. Through the arrangement of the limiting mechanism, the inserted rod drives a limiting block of the limiting mechanism to slide in a limiting groove of the limiting mechanism, and the limiting block compresses a spring such that the inserted rod moves stably left and right to achieve unlocking of the clamping cover.

It could be seen that the lock catch structure in the related art has a relatively complex structure and more steps during unlocking, thus making the unlocking inconvenient and inefficient.

SUMMARY

The present disclosure provides a latch mechanism and an electronic device case having a relatively simple structure and fewer steps during unlocking, thus being convenient for operation.

As conceived above, solutions adopted by the present disclosure are described below.

A latch mechanism includes a base assembly, a pressing assembly and a first elastic member.

The base assembly has an accommodating cavity, and a wall surface of the base assembly has a first through hole and a second through hole which are respectively communicated with the accommodating cavity.

The pressing assembly includes a main body part, a button part and a bolt part. The main body part is disposed in the accommodating cavity, and the button part and the bolt part are respectively disposed on the main body part.

The first elastic member is located in the accommodating cavity, one end of the first elastic member abuts against an inner wall of the accommodating cavity, and the other end abuts against the main body part. The button part is disposed through the first through hole, the bolt part passes through the second through hole under a pressing force of the first elastic member, and the button part is able to drive the bolt part to retract into the second through hole.

In an embodiment, the latch mechanism further includes a power mechanism, the base assembly is provided with a first groove, and the power mechanism is slidably disposed in the first groove.

In an embodiment, the power mechanism includes a second elastic member and a force transmission pin assembly, the second elastic member is located in the first groove, one end of the second elastic member abuts against a groove bottom of the first groove, and the force transmission pin assembly is connected to the other end of the second elastic member.

In an embodiment, the main body part, the button part and the bolt part are integrally formed.

In an embodiment, the main body part and the button part are separate structures, the button part is rotatable about an axis of the first through hole, two surfaces, that one is of the main body part and the other is of the button part, are facing each other, one of the two surfaces is provided with a groove, the other one of the two surfaces is provided with an unlocking protrusion, and in response to rotating the button portion is, the unlocking protrusion is capable of moving into the groove so that the bolt part snaps into a bolt hole of a housing.

In an embodiment, the surface provided with the groove is further provided with a shallow groove, a depth of the shallow groove is less than a depth of the groove, and when the button part is rotated, the unlocking protrusion is able to move into the shallow groove.

In an embodiment, the main body part and the button part are separate structures, the button part is rotatable relative to the main body part in a radial direction of the first through hole, two surfaces, that one is of the main body part and the other is of the button part, are facing each other, one of the two surfaces is provided with a groove, the other one of the two surfaces is provided with an unlocking protrusion, and in response to rotating the button portion, the groove structure is capable of being buckled with the protrusion structure so that the bolt part snaps into a bolt hole of a housing.

In an embodiment, the pressing assembly further includes a rotation shaft structure, a hole wall of the first through hole is provided with a second groove, one end of the rotation shaft structure is fixed on a side surface of the button part, and the other end of the rotation shaft structure is inserted into the second groove.

In an embodiment, the base assembly includes a base and a mounting shell connected to each other, the base and the mounting shell form the accommodating cavity, the first through hole and the second through hole are respectively disposed on the mounting shell, and one end of the first elastic member abuts on the base.

In an embodiment, a guide block is disposed on a side of the main body part where the bolt part is not provided, a guide groove is disposed on a surface of the base facing towards the mounting shell, and the guide block is able to slide into the guide groove.

In an embodiment, the surface of the base facing towards the mounting shell is further provided with a first spring groove, the side of the main body part where the bolt part is not provided is further provided with a second spring groove, one end of the first elastic member is disposed in the first spring groove, and the other end of the first elastic member is disposed in the second spring groove.

In an embodiment, the pressing assembly includes a plurality of the bolt parts, and the plurality of the bolt parts are disposed at intervals.

An electronic device case including a fixing bracket, a housing pivotally disposed on the fixing bracket and the above-mentioned latch mechanism. The base assembly is fixed on the fixing bracket, one end of the housing facing towards the base assembly has a bolt hole, and a bolt part of the latch mechanism is able to be inserted into the bolt hole.

In an embodiment, the electronic device case includes two housings, the two housings are respectively disposed on a top side and a bottom side of the fixing bracket, a pressing assembly includes two bolt groups, each of the two bolt groups includes at least one bolt part, and the two bolt groups are respectively inserted into corresponding bolt holes for respectively locking the two housings.

Figure 1:
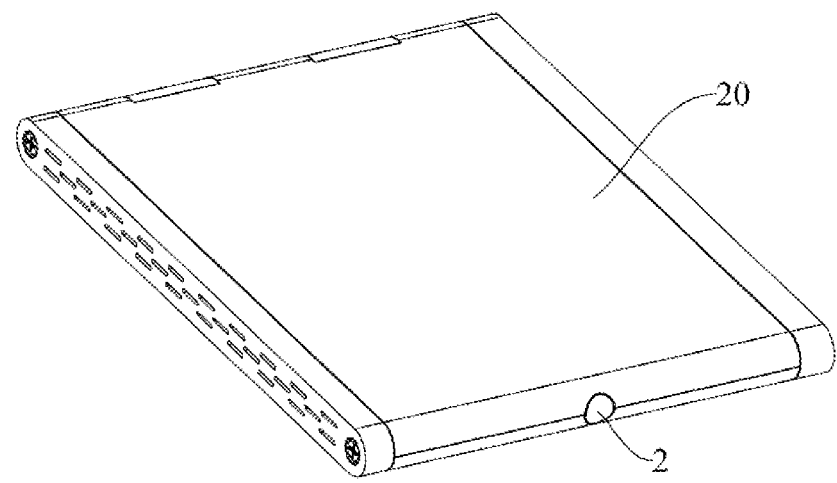
FIG. 1 is a structure view of an electronic device case according to embodiment one of the present disclosure.
Figure 2:
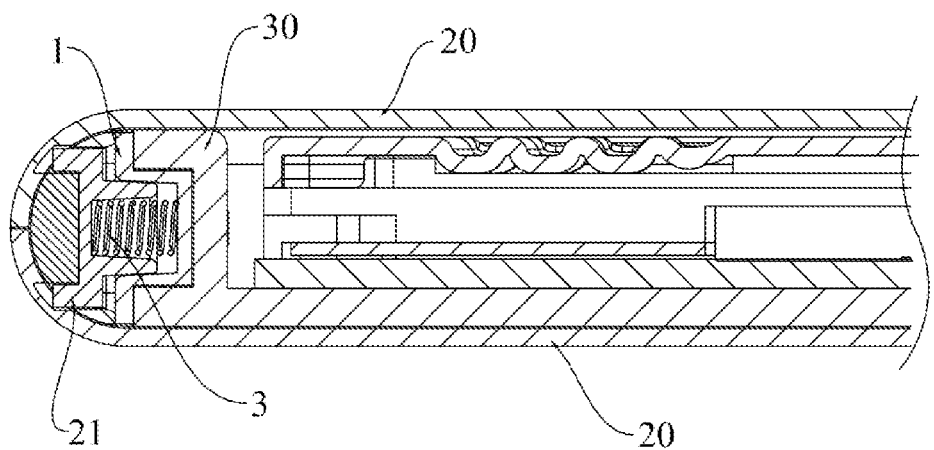
FIG. 2 is a partial cross-sectional view one of the electronic device case according to embodiment one of the present disclosure.

REFERENCE LIST 1 base assembly
101 first groove
11 first through hole
111 second groove
12 second through hole
13 base
131 guide groove
132 first spring groove
14 mounting shell
2 pressing assembly
21 main body part
2101 first side
2102 second side
211 groove
212 shallow groove
213 protrusion structure
2131 side surface
214 second spring groove
22 button part
221 unlocking protrusion
222 groove structure
2221 side wall surface
2222 rib structure
2223 top pressing structure
23 bolt part
2301 first inclined surface
24 rotation shaft structure
25 guide block
3 first elastic member
4 power mechanism
41 second elastic member
42 force transmission pin assembly
43 limiting structure
20 housing
201 bolt hole
2011 inclined wall
30 fixing bracket

DETAILED DESCRIPTION

The solution of the present disclosure is further described in conjunction with accompanying drawings and specific embodiments.

In the description of the present disclosure, it is to be noted that the orientational or positional relationships indicated by terms "center", "above", "below", "left", "right", "vertical", "horizontal", "inside", "outside" and the like are based on the orientational or positional relationships illustrated in the drawings, which are for the mere purpose of facilitating and simplifying the description of the present disclosure, and these relationships do not indicate or imply that the device or component referred to has a specific orientation and is constructed and operated in a specific orientation, and thus it is not to be construed as limiting the present disclosure. Moreover, terms like "first" and "second" are merely used for the description and are not to be construed as indicating or implying relative importance.

In the description of the present disclosure, it should be noted that unless otherwise expressly specified and limited, terms like "mounted", "connected to each other", "connected" are to be construed in a broad sense, for example, as permanently connected, detachably connected; mechanically connected or electrically connected; directly connected or indirectly connected via an intermediate medium; or internally connected between two elements. For those of ordinary skill in the art, the above terms can be construed according to specific circumstances in the present disclosure.

Embodiment One

This embodiment provides a latch mechanism having a relatively simple structure and fewer steps during unlocking, which is convenient for operation.

As shown in FIG. 1 to FIG. 7, a latch structure includes a base assembly 1, a pressing assembly 2 slidable relative to the base assembly 1, and a first elastic member 3 disposed in the base assembly 1.

The base assembly 1 has an accommodating cavity, and a wall surface of the base assembly 1 has a first through hole 11 and a second through hole 12 which are respectively communicated with the accommodating cavity. The pressing assembly 2 includes a main body part 21, a button part 22 and a bolt part 23. The main body part 21 is disposed in the accommodating cavity, and the button part 22 and the bolt part 23 are respectively disposed on the main body part 21. The button part 22 is disposed through the first through hole 11, and the bolt part 23 is disposed through the second through hole 12. The first elastic member 3 is located in the accommodating cavity, one end of the first elastic member 3 abuts against an inner wall of the accommodating cavity, and the other end of the first elastic member 3 abuts against the main body part 21. The button part 22 is disposed through the first through hole 11, and the bolt part 23 can pass through the second through hole 12 under a pressing force of the first elastic member 3 so as to insert into a bolt hole 201 on a housing 20, thereby locking the housing 20. When the button part 22 is pressed, the button part 22 can drive the bolt part 23 to retract into the second through hole 12 so as to make the bolt part 23 retract from the bolt hole 201, thereby releasing the locking of the housing 20.

Figure 6:
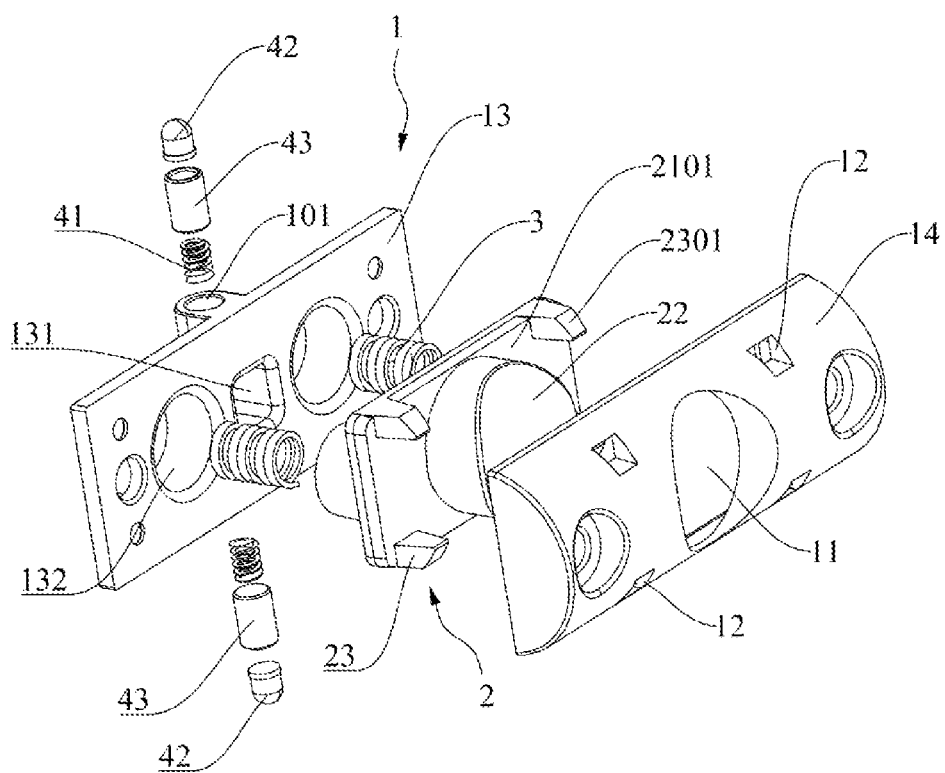
FIG. 6 is an exploded view one of a latch mechanism according to embodiment one of the present disclosure.

Furthermore, the base assembly 1 is used for being fixedly mounted on the fixing bracket 30, and the housing 20 pivotally connected to the fixing bracket 30 can press the bolt part 23 into the second through hole 12 when the housing 20 is buckled. When the housing 20 is moved towards to the base assembly 1, the housing 20 can come into contact with the bolt part 23 and press the bolt part 23 to retract into the second through hole 12; and when the bolt hole 201 is facing the second through hole 12, the bolt part 23 can snap into the bolt hole 201. Optionally, as shown in FIG. 6, the pressing assembly 2 may include a plurality of the bolt parts 23, and the plurality of the bolt parts 23 are disposed at intervals so as to improve the uniformity of locking the housing 20 by the latch mechanism. Exemplarily, the plurality of the bolt parts 23 may be disposed around the button part 22.

In the latch mechanism provided by this embodiment, the button part 22 is disposed through the first through hole 11, and the bolt part 23 is disposed through the second through hole 12, so that the button part 22 can slide in the first through hole 11 and the bolt part 23 can slide in the second through hole 12 due to the presence of the first elastic member 3. When the housing 20 needs to be locked, one end of the housing 20 is pushed to move towards the bolt part 23 so that the inner wall of the housing 20 is in contact with a first inclined surface 2301, and the housing 20 is continuously pressed so that the housing 20 can press the bolt part 23 to stick into the second through hole 12. At this time, the second through hole 12 communicates with the bolt hole 201, and the bolt part 23 stretches towards the bolt hole 201 under the pressure of an elastic force of the first elastic member 3, so that the bolt hole 201 is sleeved on the bolt part 23 and the housing 20 cannot be moved, thereby achieving the locking of the housing 20. When the locking of the housing 20 needs to be released, only the button part 22 needs to be pressed so that the button part 22, the main body part 21 and the bolt part 23 all move, and thus the bolt part 23 can leave the bolt hole 21. At this time, the housing 20 is no longer limited by the bolt part 23 and can move away from the bolt part 23, thus releasing the locking of the housing 20. In this way, the latch mechanism has a relatively simple structure and fewer steps during unlocking, which is convenient for operation, and has a relatively high unlocking efficiency and locking efficiency.

Figure 3:
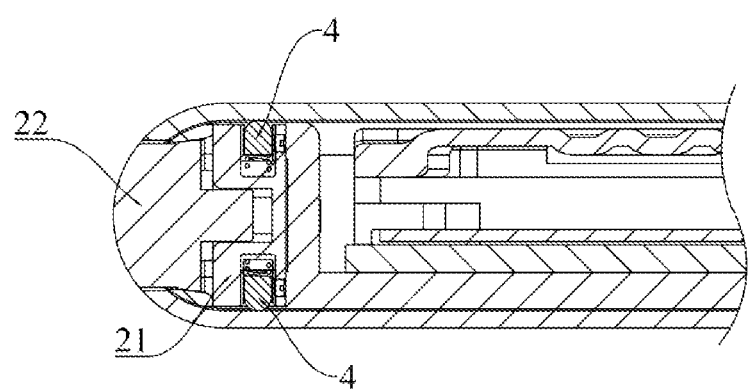
FIG. 3 is a partial cross-sectional view two of the electronic device case according to embodiment one of the present disclosure.

Optionally, as shown in FIG. 3 or FIG. 6, the latch mechanism may further include a power mechanism 4. In addition, the base assembly 1 is provided with a first groove 101 (as shown in FIG. 6), and the power mechanism 4 is slidably disposed in the first groove 101. The power mechanism 4 is used for pushing the housing 20 to move away from the fixing bracket 30 or the bolt part 23 when the bolt part 23 is pulled away from the bolt hole 201 so as to provide a certain distance between one end of the housing 20 and the fixing bracket 30, which is convenient for a user to grasp the one end of the housing 20 to open the housing 20.

Furthermore, as shown in FIG. 6, the power mechanism 4 may include a second elastic member 41 and a force transmission pin assembly 42. The second elastic member 41 is located in the first groove 101, one end of the second elastic member 41 abuts against a groove bottom of the first groove 101, and the force transmission pin assembly 42 is connected to the other end of the second elastic member 41. When the housing 20 is locked, as shown in FIG. 3, the second elastic member 41 is in a compressed state and a top of the force transmission pin assembly 42 abuts against the inner wall of the housing 20. When the locking of the housing 20 is released, the force transmission pin assembly 42 can be ejected from the first groove 101 and push the housing 20 to move under the elastic force of the second elastic member 41. In this embodiment, both the first elastic member 3 and the second elastic member 41 may be telescopic springs, which is not limited in this embodiment.

Optionally, as shown in FIG. 6, the power mechanism 4 may further include a hollow-shaped limiting structure 43 fixed in the first groove 101, and the second elastic member 41 and the force transmission pin assembly 42 are both located in the limiting structure 43. A top end of the limiting structure 43 has a first engaging block projecting inwardly, and a bottom end of the force transmission pin assembly 42 has a second engaging block projecting outwardly. The second engaging block can engage with the first engaging block to limit the movement of the force transmission pin assembly 42, thereby preventing the force transmission pin assembly 42 from being ejected from the limiting structure 43. Moreover, the arrangement of the limiting structure 43 enables the force transmission pin assembly 42 to always press against the housing 20 when the housing 20 is in the locked state, so as to ensure that the housing 20 does not loosen and generate abnormal noise.

Figure 7:
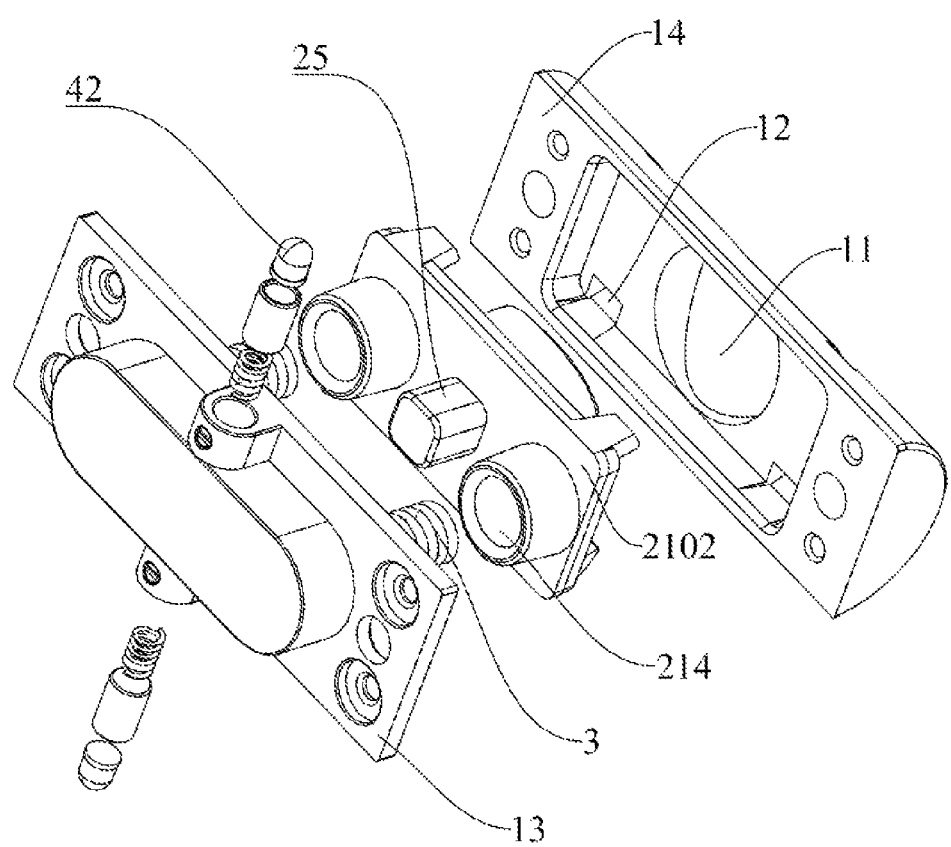
FIG. 7 is an exploded view two of the latch mechanism according to embodiment one of the present disclosure.
Figure 8:
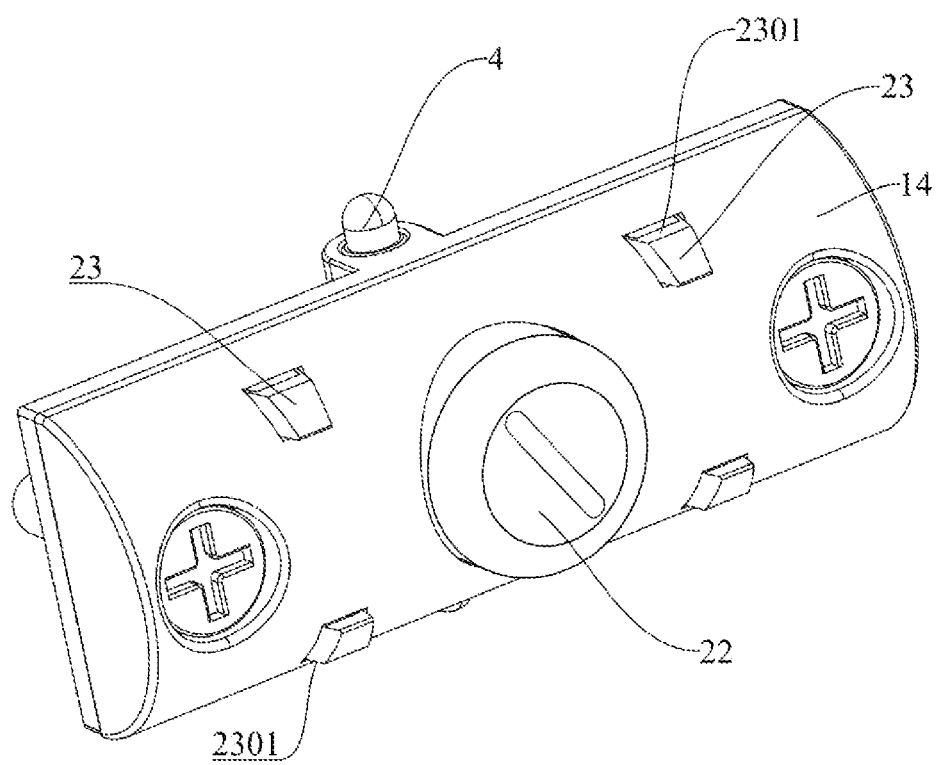
FIG. 8 is a structure view of a latch mechanism according to embodiment two of the present disclosure.
Figure 9:
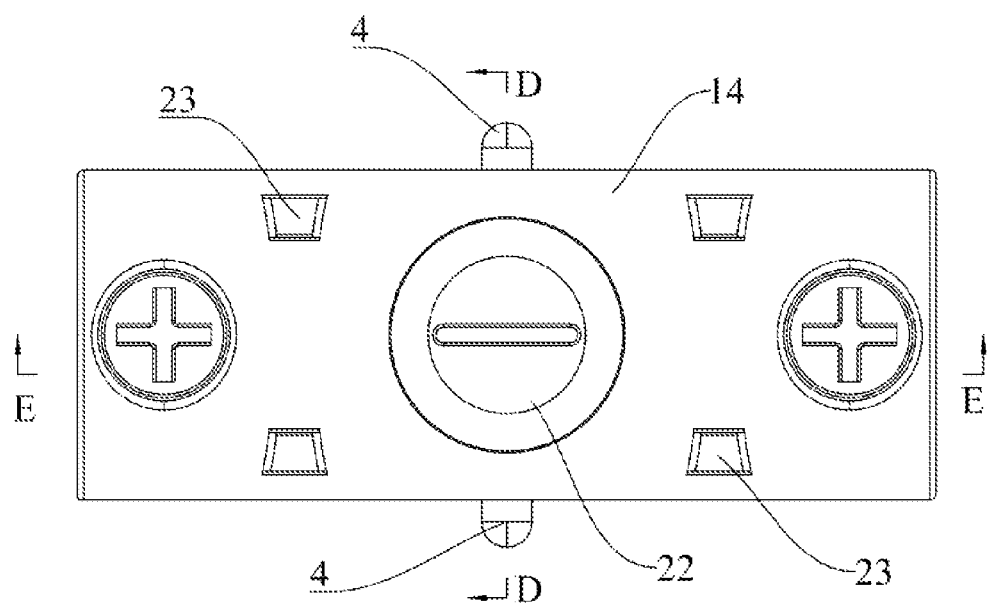
FIG. 9 is a front view of the latch mechanism according to embodiment two of the present disclosure.

As shown in FIG. 6 or FIG. 7, the main body part 21, the button part 22, and the bolt part 23 in this embodiment are integrally formed, and a cross-sectional shape of the button part 22 is a circle, but the cross-sectional shape of the button part 22 is not limited thereto.

Furthermore, the button part 22 and the bolt part 23 are located at a first side 2101 of the main body part 21, the button part 22 is located at the middle of the first side 2101, and the bolt part 23 is located at an edge portion of the first side 2101. Optionally, the pressing assembly 2 may include a plurality of bolt parts 23, and the plurality of bolt parts 23 are disposed at intervals such that a plurality of positions of the housing 20 can be locked, thereby ensuring the reliability of the latch mechanism in locking the housing 20. Exemplarily, the plurality of the bolt parts 23 are disposed around the button part 22.

Referring to FIG. 6, the base assembly 1 may include a base 13 and a mounting shell 14 connected to each other. The base 13 and the mounting shell 14 form the accommodating cavity, the first through hole 11 and the second through hole 12 are respectively disposed on the mounting shell 14, and one end of the first elastic member 3 abuts against the base 13.

Furthermore, as shown in FIG. 7, a guide block 25 is disposed on a side (the side is referred to as a second side 2102 in this embodiment) of the main body part 21 where the bolt part 23 is not provided, a guide groove 131 (as shown in FIG. 6) is disposed on a surface of the base 13 facing towards the mounting shell 14, and the guide block 25 can slide into the guide groove 131, so that the guide block 25 can slide in the guide groove 131 when the button part 22 is pressed, and thus the main body part 21 can move in a preset direction.

Optionally, as shown in FIG. 6, the surface of the base 13 facing towards the mounting shell 14 is further provided with a first spring groove 132, the second side 2102 of the main body part 21 is further provided with a second spring groove 214 facing the first spring groove 132, one end of the first elastic member 3 is disposed in the first spring groove 132, and the other end of the first elastic member 3 is disposed in the second spring groove 214. Exemplarily, as shown in FIG. 6, the latch mechanism may include two first elastic members 3, and the two first elastic members 3 are disposed at intervals. At this time, the second side 2102 is provided with two second spring grooves 214, and the base 13 is provided with two first spring grooves 132.

Exemplarily, the base 13 is further provided with a plurality of mounting holes for a fixed connection with the fixing bracket 30.

Figure 5:
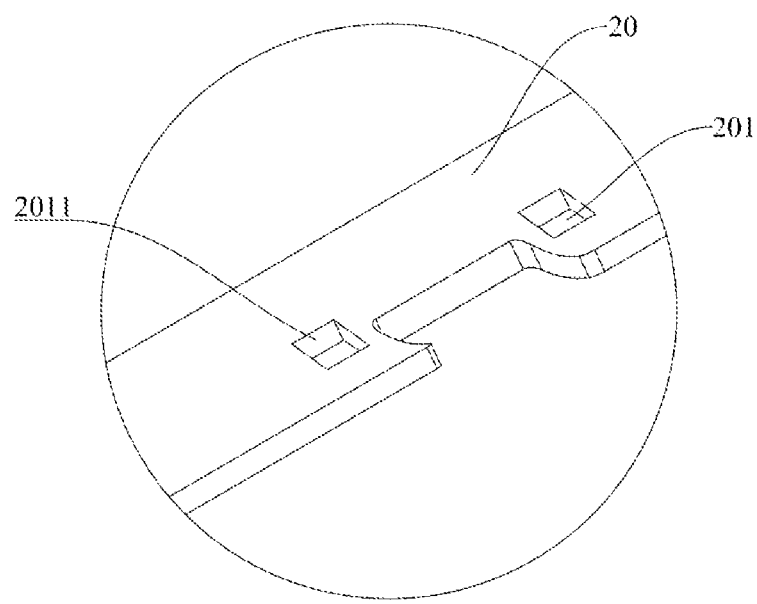
FIG. 5 is an enlarged schematic view at a position C shown in FIG. 4 according to the present disclosure.

In this embodiment, as shown in FIG. 5, an inclined wall 2011 is disposed on the inner wall of the bolt hole 201, and the inclined wall 2011 can come into contact with the first inclined surface 2301 when the housing 20 gets close to the latch part 23, so as to press the first inclined surface 2301.

When the latch mechanism provided by this embodiment is used, an operation mode for locking the housing 20 is described below. One end of the housing 20 is pressed such that the housing 20 moves towards the bolt part 23, and when the inclined wall 2011 of the housing 20 is in contact with the first inclined surface 2301, the housing 20 is continuously pressed such that the bolt part 23 is pressed by the first inclined surface 2301 to move towards the base 13, so as to press the first elastic member 3. When the bolt part 23 is moved by a preset distance, the bolt hole 201 can face the bolt part 23. At this time, the bolt part 23 is pushed away from the base 13 under the action of the elastic force of the first elastic member 3 so that the bolt part 23 can be inserted into the bolt hole 201, thereby achieving the locking of the housing 20. At this time, the second elastic member 41 is in a compressed state, and the force transmission pin assembly 42 abuts against the inner wall of the housing 20.

An operation mode for releasing the locking of the housing 20 is described below. The button part 22 is pressed such that the button part 22 moves towards the base 13. At this time, the button part 22 drives the bolt part 23 to move towards the base 13 through the main body part 21, and thus the bolt part 23 retracts from the second through hole 12 and the bolt hole 201. When the bolt part 23 is moved by a certain distance, the bolt part 23 can be completely pulled away from the bolt hole 201, and at this time, the housing 20 is no longer locked by the bolt part 23. Thereafter, under the action of the second elastic member 41, the force transmission pin assembly 42 can push the housing 20 away from the bolt part 23 and push the housing 20 to move for a distance so as to facilitate lifting of the housing 20 by the user.

Embodiment Two

The latch mechanism provided by this embodiment differs from the embodiment one in that the structure of the pressing assembly 2 is different.

Figure 10:
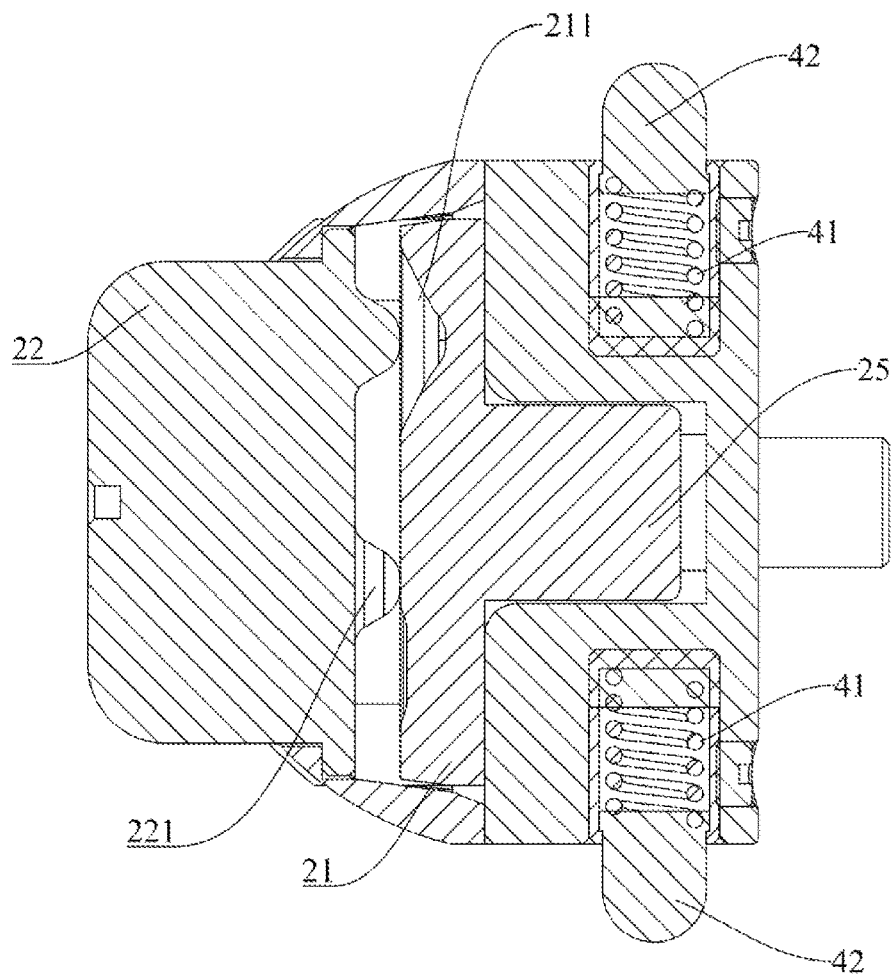
FIG. 10 is a cross-sectional view taken along a line D-D shown in FIG. 9 according to the present disclosure.
Figure 11:
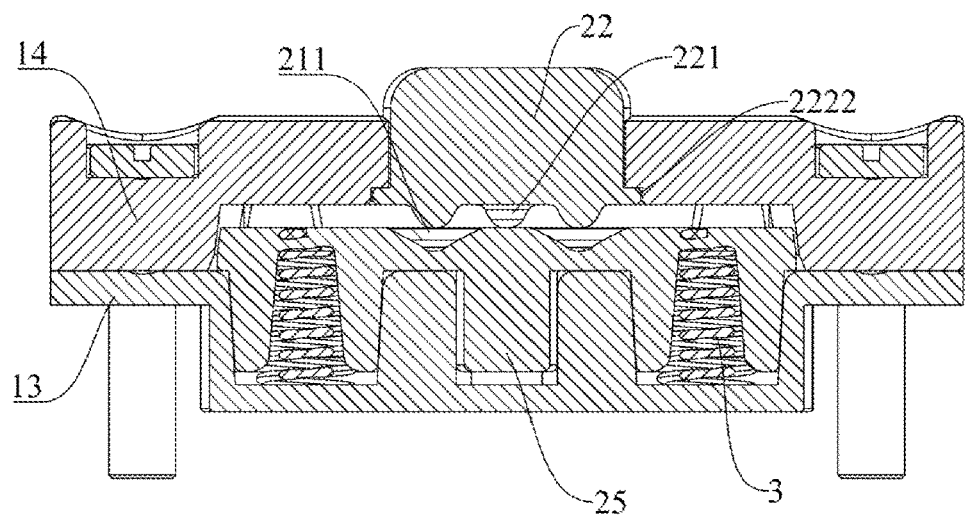
FIG. 11 is a cross-sectional view taken along a line E-E shown in FIG. 9 according to the present disclosure.

Specifically, referring to FIG. 8 to FIG. 13, the main body part 21 and the button part 22 in this embodiment are separate structures. The button part 22 is rotatable about an axis of the first through hole 11 so that the bolt part 23 can be pulled away from the bolt hole 201, and a size of one end of the button part 22 facing towards the main body part 21 is larger than a size of the first through hole 11 so as to prevent the button part 22 from slipping out of the first through hole 11. Exemplarily, as shown in FIG. 11, the end of the button part 22 facing towards the main body part 21 may be provided with a rib structure 2222 that can be stuck in the mounting shell 14.

Figure 12:
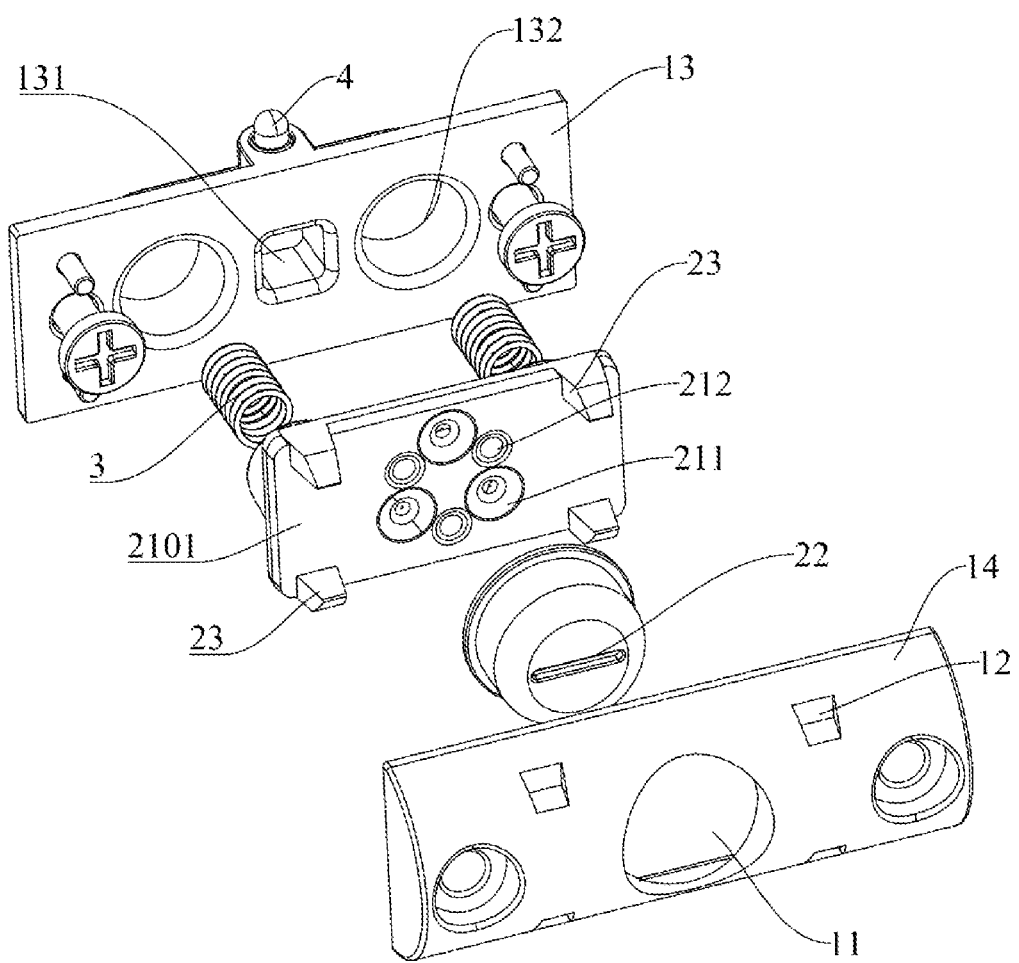
FIG. 12 is an exploded view one of the latch mechanism according to embodiment two of the present disclosure.

Optionally, as shown in FIG. 12, the first through hole 11 may be a circular hole, and a cross-sectional shape of the button part 22 may be a circle so as to facilitate rotation of the button part 22 within the first through hole 11.

As shown in FIG. 10 to FIG. 13, one of two surfaces of the main body part 21 and the button part 22 facing each other is provided with a groove 211, and the other one of the two surfaces of the main body part 21 and the button part 22 facing each other is provided with an unlocking protrusion 221. When the button part 22 is rotated, the unlocking protrusion 221 can be moved into the groove 211 so that the bolt part 23 snaps into in the bolt hole 201 of the housing 20. It is to be noted that when a button part 22 is rotated to a first position, the unlocking protrusion 221 is located in the groove 211, and at this time, a distance between the button part 22 and the main body part 21 is minimum so that when the first elastic member 3 pushes the main body part 21, the button part 22, and the bolt part 23 to move towards the mounting shell 14, the bolt part 23 has a sufficient length to stretch into the second through hole 12 and the bolt hole 201, thereby locking the housing 20. When the button part 22 is rotated to a second position, the unlocking protrusion 221 is not located in the groove 211, but abutted at another position, and a height at the another location is higher than a height of the groove 211, so that the main body part 21 presses the first elastic member 3. At this time, the distance between the button part 22 and the main body part 21 is maximum so that when the first elastic member 3 pushes the main body part 21, the button part 22, and the bolt part 23 to move towards the mounting shell 14, the bolt part 23 does not have a sufficient length to stretch into the second through hole 12 or the latch hole 201. At this time, the locking of the housing 20 can be released. It is to be noted that FIG. 10 to FIG. 13 of this embodiment show a case where the groove 211 is disposed on a first side 2101 of the main body part 21, and the unlocking protrusion 221 is disposed on the button part 22.

Furthermore, as shown in FIG. 12, a surface (the surface may be the first side 2101) provided with the groove 211 is further provided with a shallow groove 212, where a depth of the shallow groove 212 is smaller than a depth of the groove 211. When the button part 22 is rotated, the unlocking protrusion 221 can be moved into the shallow groove 212, and when the unlocking protrusion 221 is located in the shallow groove 212, the bolt part 23 is pulled away from the bolt hole 201 so as to release the locking of the housing 20. The arrangement of the shallow groove 212 can prevent accidental sliding when the unlocking protrusion 221 is not located in the groove 211.

Figure 13:
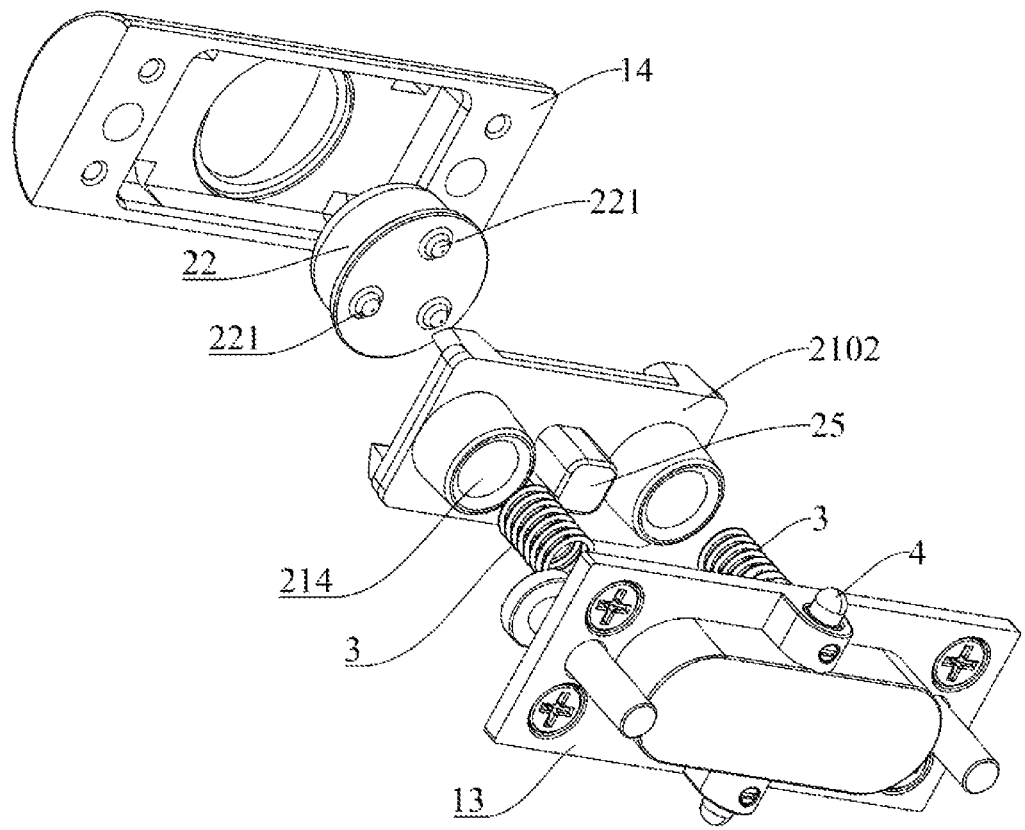
FIG. 13 is an exploded view two of the latch mechanism according to embodiment two of the present disclosure.
Figure 14:
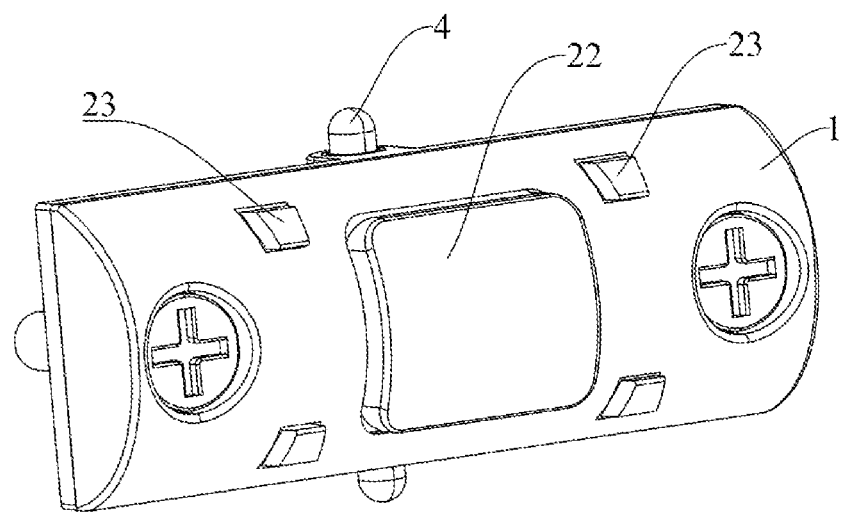
FIG. 14 is a structure view of a latch mechanism according to embodiment three of the present disclosure.
Figure 15:
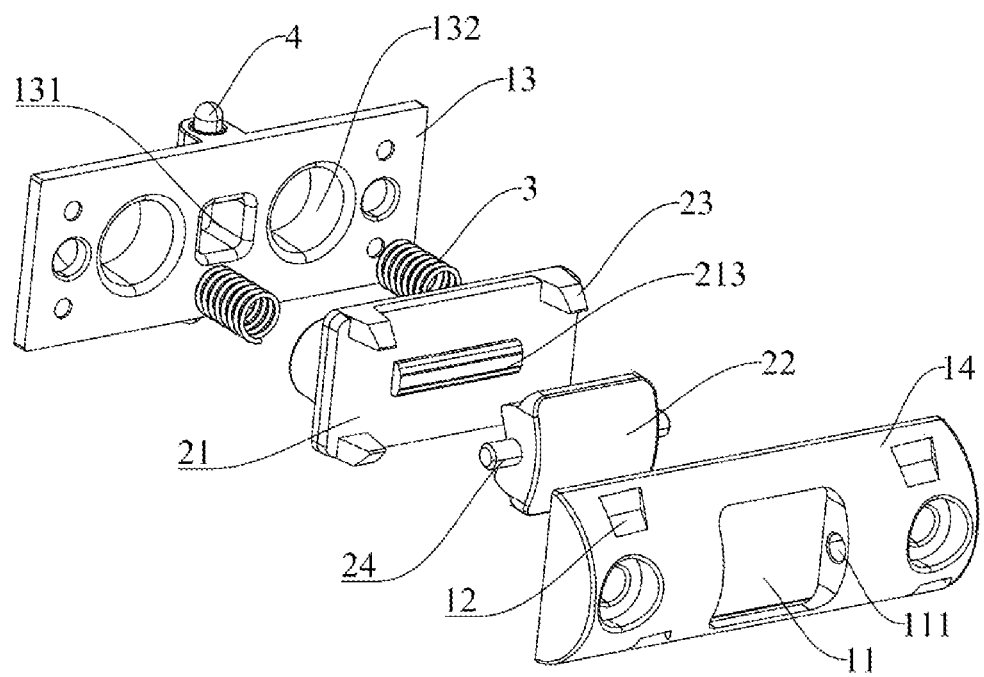
FIG. 15 is an exploded view one of the latch mechanism according to embodiment three of the present disclosure.

In addition, in order to facilitate the rotation of the button part 22, as shown in FIG. 11 or FIG. 12, the cross-sectional shape of the groove 211 may be a circle, the groove 211 may be trumpet-shaped, that is, an inner wall of the groove 211 is a camber surface, and a circumference of the cross-sectional shape gradually decreases in the direction from the outside to the inside of the groove 211. Correspondingly, as shown in FIG. 10 or FIG. 13, the unlocking protrusion 221 is straw-shaped to fit with the shape of the groove 211 so as to smoothly slide into or out of the groove 211.

Optionally, a plurality of grooves 211 may be provided, and/or, a plurality of unlocking protrusions 221 may be provided. When the plurality of grooves 211 and the plurality of unlocking protrusions 221 are provided, as shown in FIG. 12 and FIG. 13, the plurality of unlocking protrusions 221 can be simultaneously located in the plurality of grooves 211, respectively.

Furthermore, as shown in FIG. 12, a plurality of shallow grooves 212 may also be provided, and the plurality of shallow grooves 212 may be disposed between two adjacent grooves 211. The plurality of grooves 211 and the plurality of shallow grooves 212 are disposed circumferentially at intervals so that the unlocking protrusions 221 can be located in the grooves 211 or the shallow grooves 212 when the button part 22 is rotated.

Other structures of this embodiment are the same as structures of embodiment one and will not be repeated herein.

When the latch mechanism provided by this embodiment is used, an operation mode for locking the housing 20 is described below. The button part 22 is rotated such that the unlocking protrusion 221 is located in the groove 211, and then the later steps are the same as those in embodiment one, which will not be repeated herein.

An operation mode for releasing the locking of the housing 20 is described below. The button part 22 is rotated such that the unlocking protrusion 221 slides out of the groove 211 and slides into the shallow groove 212. During this process, the button part 22 pushes against the main body part 21 to move towards the base 13, such that the main body part 21 drives the bolt part 23 to move towards the base 13. When the bolt part 23 moves a certain distance, the bolt part 23 can be withdrawn from the bolt hole 201, and the housing 20 will not be locked, thereby releasing the locking of the housing 20.

Embodiment Three

The latch mechanism provided by this embodiment differs from the embodiment one in that the structure of the pressing assembly 2 is different.

Specifically, referring to FIG. 14 to FIG. 19, the main body part 21 and the button part 22 in this embodiment are separate structures. Moreover, the button part 22 is rotatable relative to the main body part 21 in the radial direction of the first through hole 11, that is, the button part 22 is rotatable up and down. One of two surfaces of the main body part 21 and the button part 22 facing each other is provided with a protrusion structure 213, and the other one of the two surfaces of the main body part 21 and the button part 22 facing each other is provided with a groove structure 222. The protrusion structure 213 and the groove structure 222 both extend in the radial direction of the first through hole 11, and when the button part 22 is rotated, the groove structure 222 can be buckled with the protrusion structure 213 so that the bolt part 23 snaps into the bolt hole 201 of the housing 20. It is to be noted that FIG. 14 to FIG. 19 are schematic views in which the protrusion structure 213 is disposed on the main body part 21 and the groove structure 222 is disposed on the button part 22.

Figure 16:
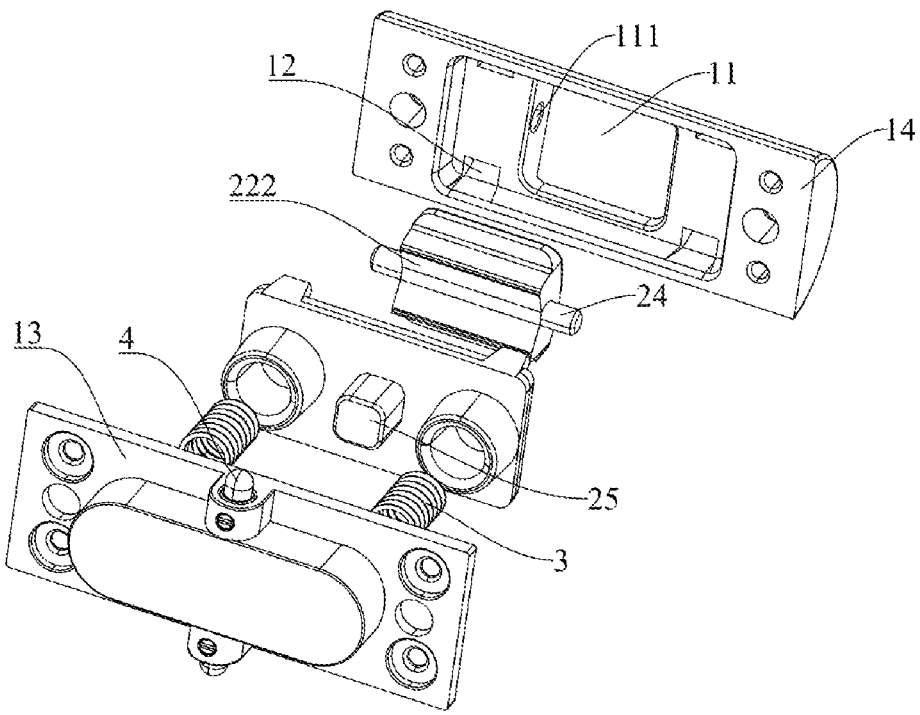
FIG. 16 is an exploded view two of the latch mechanism according to embodiment three of the present disclosure.

Furthermore, referring to FIG. 16, the pressing assembly 2 may further include a rotation shaft structure 24. In addition, a hole wall of the first through hole 11 has a second groove 111, one end of the rotation shaft structure 24 is fixed to a side surface of the button part 22, and the other end of the rotation shaft structure 24 is inserted into the second groove 111 so that the button part 22 can be rotated in the first through hole 11.

Figure 17:
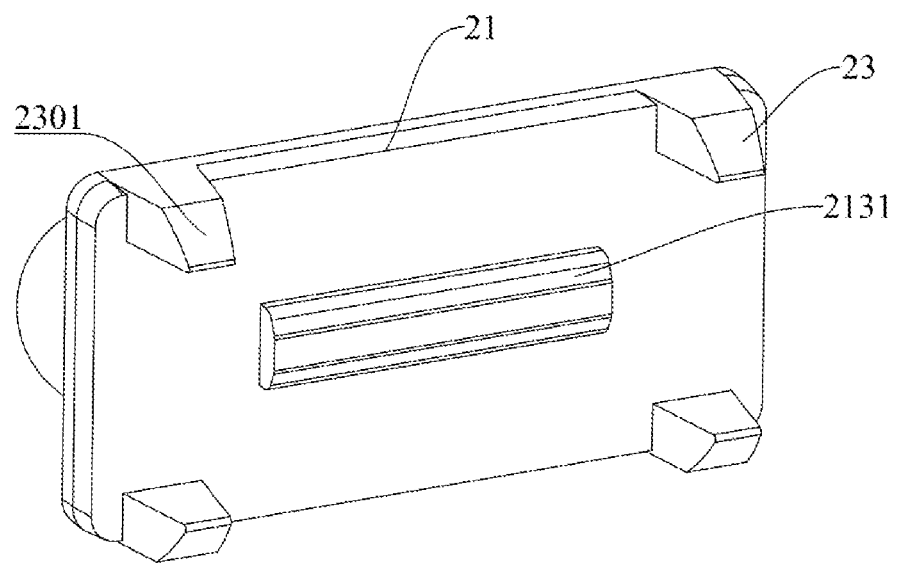
FIG. 17 is a schematic view of a main body part, a bolt part, and a protrusion structure according to embodiment three of the present disclosure.
Figure 18:
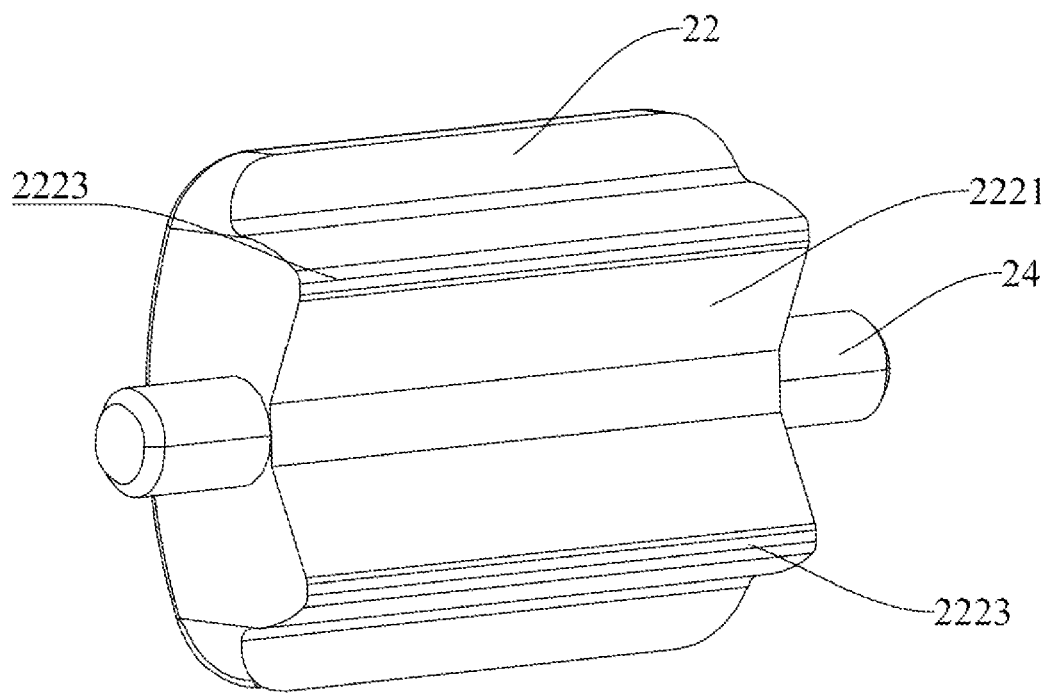
FIG. 18 is a structure view of a button part according to embodiment three of the present disclosure.
Figure 19:
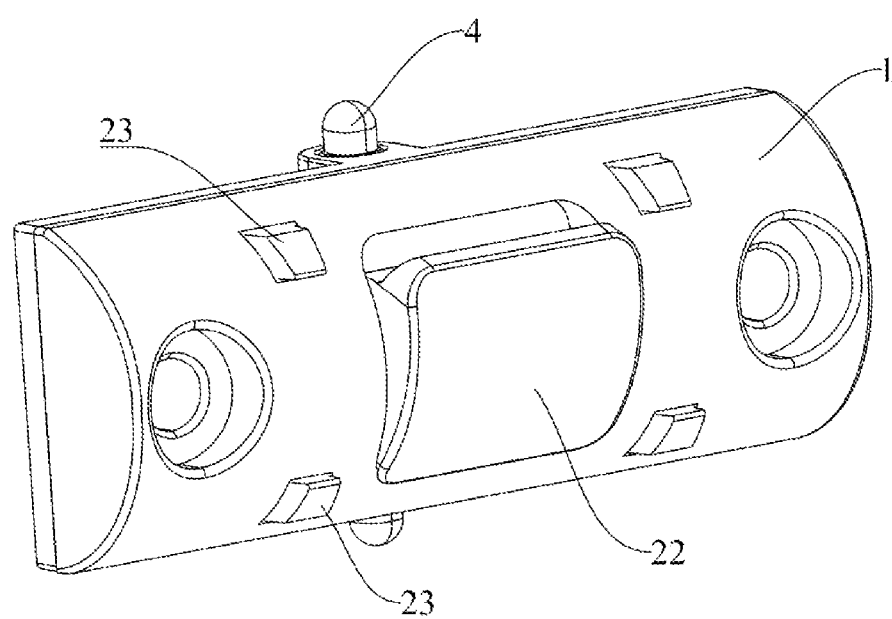
FIG. 19 is a reference view showing a using status of the latch mechanism according to embodiment three of the present disclosure.

In order to facilitate the rotation of the protrusion structure 213 relative to the groove structure 222, as shown in FIG. 17, the protrusion structure 213 is arch-bridge-shaped, a side surface 213 of the protrusion structure 213 is an inclined surface, and a top surface of the protrusion structure 213 is a flat surface. Correspondingly, a groove bottom of the groove structure 222 is a flat surface, a side wall surface 2221 of the groove structure 222 is an inclined surface, and a portion of an edge of the groove structure 222 that contacts the button part 22 forms a top pressing structure 2223.

Other structures of this embodiment are the same as structures of embodiment one and will not be repeated herein.

When the latch mechanism provided by this embodiment is used, an operation mode for locking the housing 20 is described below. An upper edge or a lower edge of the button part 22 is pressed so that the protrusion structure 213 snaps into the groove structure 222. At this time, a top surface of the protrusion structure 213 can be brought into contact with the groove bottom of the groove structure 222, and the latch mechanism presents a state shown in FIG. 14. In this case, a distance between the main body part 21 and the button part 22 is minimized, and when the first elastic member 3 pushes the main body part 21 to move towards the mounting shell 14, the bolt part 23 has a sufficient length to stretch out of the second through hole 12 and stretch into the bolt hole. Subsequent steps are the same as those in embodiment one, which will not be repeated herein.

An operation mode for releasing the locking of the housing 20 is described below. The upper edge of the button part 22 is pressed so that the button part 22 is rotated upward with the rotation shaft structure 24 as a rotation center. During this process, the groove structure 222 slides with respect to the protrusion structure 213 through the side wall surface 2221, thereby releasing the engagement between the groove structure 222 and the protrusion structure 213. When the button part 22 is rotated to a certain angle, the top pressing structure 2223 of an upper half of the button part 22 pushes the side surface 2131 of an upper half of the protrusion structure 213 so as to allow an upper-half bolt part 23 to be withdrawn from the bolt hole 201 in an upper housing 20, thus completing the unlocking of the upper housing 20.

Similarly, steps of unlocking a lower housing 20 are described below. The lower edge of the button part 22 is pressed so that the button part 22 is rotated downward with the rotation shaft structure 24 as a rotation center. During this process, the groove structure 222 slides with respect to the protrusion structure 213 through the side wall surface 2221, thereby releasing the engagement between the groove structure 222 and the protrusion structure 213. When the button part 22 is rotated to a certain angle, the top pressing structure 2223 of a lower half of the button part 22 pushes the side surface 2131 of a lower half of the protrusion structure 213 so as to allow a lower-half bolt part 23 to be withdrawn from the bolt hole 201 in a lower housing 20, thus completing the unlocking of the lower housing 20.

Embodiment Four

Figure 4:
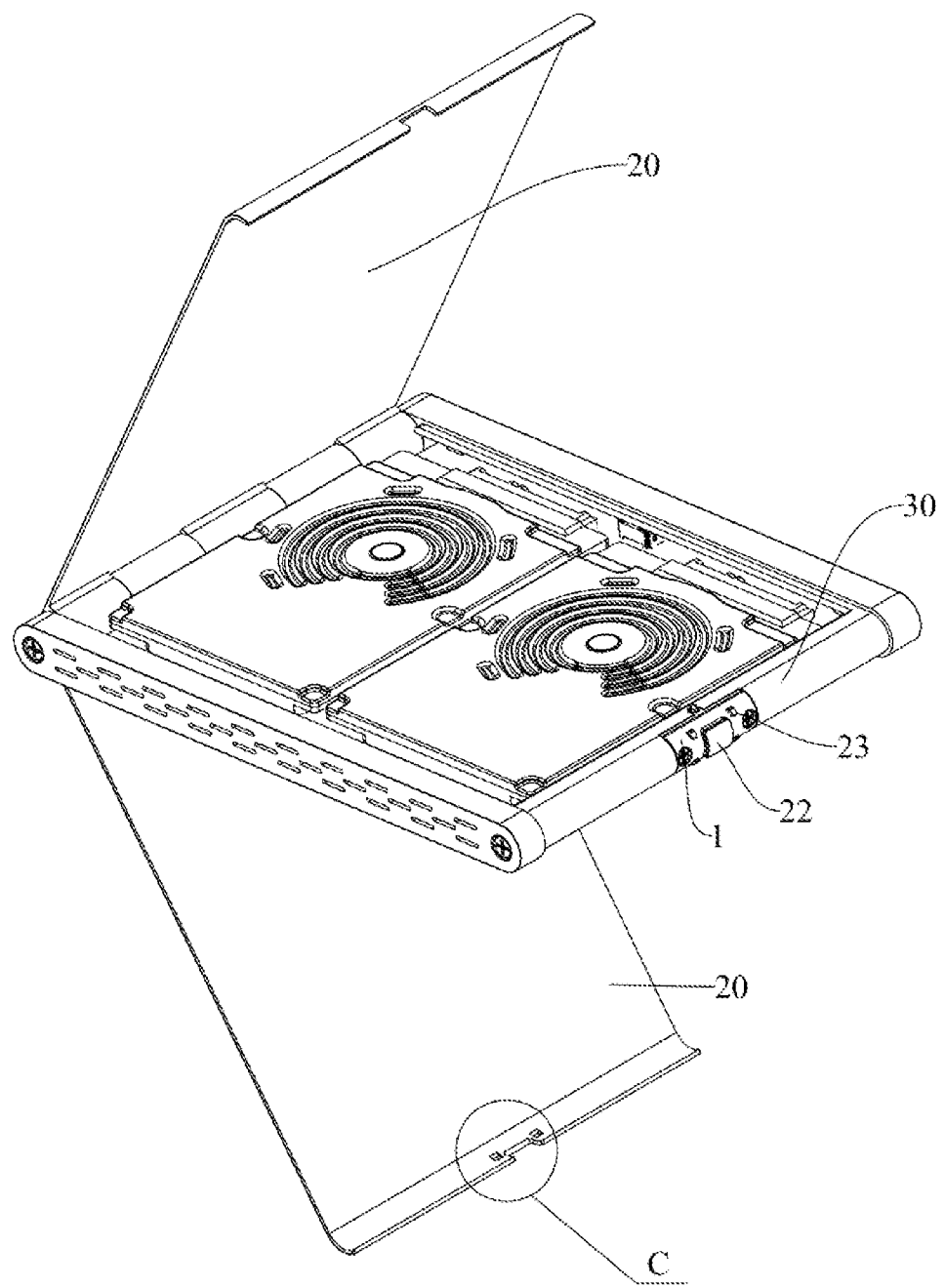
FIG. 4 is a reference view showing a using status of an electronic device case according to embodiment one of the present disclosure.

This embodiment provides an electronic device case, as shown in FIG. 1 to FIG. 5, the electronic device case includes at least a fixing bracket 30, a housing 20 pivotally disposed on the fixing bracket 30 and the latch mechanism of any one of embodiment one to embodiment three. The base assembly 1 is fixed on the fixing bracket 30, and exemplarily, as shown in FIG. 4, the base assembly 1 may be fixed to an end of the fixing bracket 30. As shown in FIG. 5, one end of the housing 20 facing towards the base assembly 1 has a bolt hole 201, and a bolt part 23 of the latch mechanism can be inserted into the bolt hole 201.

Furthermore, as shown in FIG. 4, the electronic device case may include two housings 20, and the two housings 20 are respectively disposed on a top side and a bottom side of the fixing bracket 30. Moreover, the pressing assembly 2 may include two bolt groups corresponding to the two housings 20 in one-to-one correspondence, each bolt group includes at least one bolt part 23, and the two bolt groups are respectively inserted into bolt holes 201 of corresponding housings 20 so as to respectively lock the two housings 20.

Optionally, other structures such as a circuit board may further be provided on the fixing bracket 30, which is not limited in this embodiment.

The above embodiments describe only the basic principles and characteristics of the present disclosure and the present disclosure is not limited to the above embodiments. Various modifications and changes may be made in the present disclosure without departing from the spirit and scope of the present disclosure. These modifications and changes fall within the scope of the present disclosure. The scope of the present disclosure is defined by the appended claims and equivalents thereof.

What is claimed is:

1. A latch mechanism, comprising: a base assembly, wherein the base assembly has an accommodating cavity, and a wall surface of the base assembly formed an external surface on a first end of a fixing bracket, the wall surface has a first through hole and a second through hole which are respectively communicated with the accommodating cavity; a pressing assembly, which comprises a main body part, a button part and a bolt part, wherein the main body part is disposed in the accommodating cavity, and the button part and the bolt part are respectively disposed on the main body part; and a first elastic member, which is located in the accommodating cavity, wherein one end of the first elastic member abuts against an inner wall of the accommodating cavity and the other end of the first elastic member abuts against the main body part, the button part is disposed through the first through hole, the bolt part passes through the second through hole under a pressing force of the first elastic member, and the button part is able to drive the bolt part to retract into the second through hole; the main body part and the button part are separate structures; the button part is rotatable about an axis along the first through hole; two surfaces, that one is of the main body part and the other is of the button part, are facing each other, one of the two surfaces is provided with a groove, the other one of the two surfaces is provided with an unlocking protrusion, and in response to rotating the button portion, the unlocking protrusion is capable of moving into the groove so that the bolt part snaps into a bolt hole of a housing when the housing is rotated on a second end of the fixing bracket and covered the wall surface.

2. The latch mechanism of claim 1, further comprising a power mechanism, wherein the base assembly is provided with a first groove, and the power mechanism is slidably disposed in the first groove.

3. The latch mechanism of claim 2, wherein the power mechanism comprises a second elastic member and a force transmission pin assembly, the second elastic member is located in the first groove, one end of the second elastic member abuts against a groove bottom of the first groove, and the force transmission pin assembly is connected to the other end of the second elastic member.

4. The latch mechanism of any one of claim 1, wherein the main body part, the button part and the bolt part are integrally formed.

5. The latch mechanism of claim 1, wherein the surface provided with the groove is further provided with a shallow groove, a depth of the shallow groove is less than a depth of the groove, and when the button part is rotated, the unlocking protrusion is capable of moving into the shallow groove.

6. The latch mechanism of any one of claim 1, wherein the main body part and the button part are separate structures; the button part is rotatable relative to the main body part in a radial direction of the first through hole; two surfaces, that one is of the main body part and the other is of the button part, are facing each other, one of the two surfaces is provided with a protrusion structure, the other one of the two surfaces is provided with a groove structure, and when the button portion is rotated, the groove structure is capable of being buckled on the protrusion structure so that the bolt part snaps into a bolt hole of a housing.

7. The latch mechanism of claim 6, wherein the pressing assembly further comprises a rotation shaft structure, a hole wall of the first through hole is provided with a second groove, one end of the rotation shaft structure is fixed on a side surface of the button part, and the other end of the rotation shaft structure is inserted into the second groove.

8. The latch mechanism of any one of claim 1, wherein the base assembly comprises a base and a mounting shell connected to each other, the base and the mounting shell form the accommodating cavity, the first through hole and the second through hole are respectively disposed on the mounting shell, and the one end of the first elastic member abuts against the base.

9. The latch mechanism of claim 8, further comprising: a guide block disposed on a side of the main body part where the bolt part is not provided, and a guide groove disposed on a surface of the base facing towards the mounting shell; wherein the guide block is able to slide into the guide groove.

10. The latch mechanism of claim 9, wherein the surface of the base facing towards the mounting shell is further provided with a first spring groove, the side of the main body part, where the bolt part is not provided, is further provided with a second spring groove, the one end of the first elastic member is disposed in the first spring groove, and the other end of the first elastic member is disposed in the second spring groove.

11. The latch mechanism of any one of claim 1, wherein the pressing assembly comprises a plurality of bolt parts, and the plurality of the bolt parts are disposed at intervals.

12. An electronic device case, comprising a fixing bracket, two housings pivotally disposed on a first end of the fixing bracket, the two housings are respectively covered a top side and a bottom side of the fixing bracket; and a latch mechanism, wherein the latch mechanism comprises: a base assembly, wherein the base assembly has an accommodating cavity, and a wall surface of the base assembly formed an external surface of the fixing bracket on a second end opposite to the first end, the wall surface has a first through hole and at least one second through hole located on the top and bottom sides respectively, the first and second through holes are respectively communicated with the accommodating cavity; a pressing assembly, which comprises a main body part, a button part and two bolt groups, each of the two bolt groups comprises at least one bolt part, wherein the main body part is disposed in the accommodating cavity, and the button part and the bolt parts are respectively disposed on the main body part; and a first elastic member, which is located in the accommodating cavity, wherein one end of the first elastic member abuts against an inner wall of the accommodating cavity and the other end of the first elastic member abuts against the main body part, the button part is disposed through the first through hole, each of the at least one bolt part passes through the at least one second through hole under a pressing force of the first elastic member, and the button part is able to drive each of the at least one bolt part to retract into each of the at least one second through hole; and wherein the base assembly is fixed on the fixing bracket, each end of the two housings facing towards the base assembly has at least one bolt hole, and each of the at least one bolt part of the two bolt groups of the latch mechanism is able to be inserted into each of the bolt at least one hole and locked the associated housing.

13. The latch mechanism of any one of claim 2, wherein the main body part, the button part and the bolt part are integrally formed.

14. The latch mechanism of any one of claim 3, wherein the main body part, the button part and the bolt part are integrally formed.

15. The latch mechanism of any one of claim 2, wherein the main body part and the button part are separate structures; the button part is rotatable about an axis of the first through hole; two surfaces, that one is of the main body part and the other is of the button part, are facing each other, one of the two surfaces is provided with a groove, the other one of the two surfaces is provided with an unlocking protrusion, and in response to rotating the button portion, the unlocking protrusion is capable of moving into the groove so that the bolt part snaps into a bolt hole of a housing.

16. The latch mechanism of any one of claim 3, wherein the main body part and the button part are separate structures; the button part is rotatable about an axis of the first through hole; two surfaces, that one is of the main body part and the other is of the button part, are facing each other, one of the two surfaces is provided with a groove, the other one of the two surfaces is provided with an unlocking protrusion, and in response to rotating the button portion, the unlocking protrusion is capable of moving into the groove so that the bolt part snaps into a bolt hole of a housing.

17. The latch mechanism of any one of claim 2, wherein the main body part and the button part are separate structures; the button part is rotatable relative to the main body part in a radial direction of the first through hole; two surfaces, that one is of the main body part and the other is of the button part, are facing each other, one of the two surfaces is provided with a protrusion structure, the other one of the two surfaces is provided with a groove structure, and when the button portion is rotated, the groove structure is capable of being buckled on the protrusion structure so that the bolt part snaps into a bolt hole of a housing.

18. The latch mechanism of any one of claim 3, wherein the main body part and the button part are separate structures; the button part is rotatable relative to the main body part in a radial direction of the first through hole; two surfaces, that one is of the main body part and the other is of the button part, are facing each other, one of the two surfaces is provided with a protrusion structure, the other one of the two surfaces is provided with a groove structure, and when the button portion is rotated, the groove structure is capable of being buckled on the protrusion structure so that the bolt part snaps into a bolt hole of a housing.

* * * * *